US011196024B2

(12) United States Patent
 Wang

(10) Patent No.: US 11,196,024 B2
(45) Date of Patent: Dec. 7, 2021

(54) DISPLAY PANEL INCLUDING PERIPHERAL AREA WITH PLURALITY OF REFRACTION PIECES HAVING OPENINGS FACING SUBSTRATE, AND MANUFACTURING METHOD THEREOF

(71) Applicant: Wuhan China Star Optoelectronics Semiconductor Display Technology Co., Ltd., Wuhan (CN)

(72) Inventor: Kun Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 54 days.

(21) Appl. No.: 16/753,775

(22) PCT Filed: Feb. 18, 2020

(86) PCT No.: PCT/CN2020/075763
§ 371 (c)(1),
(2) Date: Apr. 5, 2020

(87) PCT Pub. No.: WO2021/109339
PCT Pub. Date: Jun. 10, 2021

(65) Prior Publication Data
US 2021/0175467 A1 Jun. 10, 2021

(30) Foreign Application Priority Data
Dec. 4, 2019 (CN) .......................... 201911227976.1

(51) Int. Cl.
*H01L 51/52* (2006.01)
*H01L 51/56* (2006.01)
(52) U.S. Cl.
CPC ...... *H01L 51/5253* (2013.01); *H01L 51/5246* (2013.01); *H01L 51/5275* (2013.01); *H01L 51/56* (2013.01); *H01L 2251/303* (2013.01)
(58) Field of Classification Search
CPC ............ H01L 51/5253; H01L 51/5246; H01L 51/5275; H01L 51/56
See application file for complete search history.

(56) References Cited

U.S. PATENT DOCUMENTS

2017/0186830 A1* 6/2017 Tokuda .............. H01L 27/3246
2017/0346041 A1* 11/2017 Kim .................... H01L 27/3244
2020/0152705 A1* 5/2020 Son ....................... H01L 27/322
2020/0313116 A1* 10/2020 Li ........................... H01L 51/56

* cited by examiner

*Primary Examiner* — Matthew E. Gordon

(57) ABSTRACT

A display panel includes a substrate and an encapsulation layer disposed on the substrate. Through disposing a refraction piece in a thin film encapsulation layer at a peripheral area of the display panel, having the refraction piece being disposed in a first encapsulation organic layer of the encapsulation layer, and refracting light through an opening of the refraction piece to a display area when light at the peripheral area passes through the substrate, display brightness at a place of the display area close to the peripheral area is increased.

10 Claims, 3 Drawing Sheets

DISPLAY PANEL INCLUDING PERIPHERAL AREA WITH PLURALITY OF REFRACTION PIECES HAVING OPENINGS FACING SUBSTRATE, AND MANUFACTURING METHOD THEREOF

RELATED APPLICATIONS

This application is a National Phase of PCT Patent Application No. PCT/CN2020/075763 having International filing date of Feb. 18, 2020, which claims the benefit of priority of Chinese Patent Application No. 201911227976.1 filed on Dec. 4, 2019. The contents of the above applications are all incorporated by reference as if fully set forth herein in their entirety.

FIELD AND BACKGROUND OF THE INVENTION

The present invention relates to the field of display technology, and especially to a display panel and a manufacturing method thereof.

Organic light-emitting diode (OLED) devices have advantages such as simple structure, fast response times, self-luminescence, low power consumption, etc., and have been widely applied in display fields such as cell phone, tablet, television, etc. With development of product differentiation, bendable and foldable screens have become a trend.

SUMMARY OF THE INVENTION

Wherein, a design of a curved screen has already been adopted in many products. However, an edge design makes that brightness and color precision at panel edges are not as satisfactory as that in a middle area, and causes an unsatisfactory visual experience.

Therefore, a new display panel is in urgent need to resolve problems such as an unsatisfactory visual experience at edges of a display area of a display panel in the conventional technology.

The present invention is to provide a display panel and a manufacturing method thereof. Through disposing a refraction piece in a thin film encapsulation layer at a peripheral area of the display panel, the refraction piece being disposed in a first encapsulation organic layer of the encapsulation layer, and used to refract light to the display area after the light at the peripheral area passing the opening when it passes through the substrate, display brightness at a place of the display area closer to the peripheral area is increased.

In order to resolve the above-mentioned problem, the present invention provides a display panel that includes a substrate including a display area and a peripheral area; a thin film transistor layer disposed on the substrate and corresponding to the display area; a display layer disposed on one side of the thin film transistor layer away from the substrate; and an encapsulation layer disposed on the display layer and the peripheral area of the substrate; wherein at the peripheral area, the encapsulation layer includes a plurality of refraction pieces, each of the refraction pieces has an opening, the opening faces the substrate, and light at the peripheral area is refracted to the display area by the refraction pieces when passing through the substrate.

Furthermore, a material of the refraction pieces includes silicon nitride, silica, silicon oxynitride, silicon carbonitride, zinc oxide, or aluminum oxide.

Furthermore, the encapsulation layer includes: a first encapsulation inorganic layer disposed on the display layer and the peripheral area of the substrate, wherein at the peripheral area, the first encapsulation inorganic layer includes a plurality of pieces of inorganic layer; a first encapsulation organic layer disposed on the first encapsulation inorganic layer; and a second encapsulation inorganic layer disposed on one side of the first encapsulation organic layer away from the first encapsulation inorganic layer; wherein the refraction pieces are disposed in the first encapsulation organic layer, and each of the pieces of inorganic layer is disposed between adjacent refraction pieces.

Furthermore, a sectional shape of the refraction pieces includes an arc, a line, or a square.

Furthermore, a transparent adhesive layer disposed on one side of the encapsulation layer away from the substrate; wherein a plurality of spherical granules is disposed in the transparent adhesive layer.

The present invention further provides a manufacturing method of a display panel that includes following steps: providing a substrate, wherein the substrate includes a display area and a peripheral area; forming a thin film transistor layer and a display layer at the display area of the substrate sequentially; forming a plurality of organic liquid drops on the peripheral area of the substrate; depositing a first encapsulation inorganic layer on the display layer and the peripheral area of the substrate, wherein the first encapsulation inorganic layer forms a piece of inorganic layer between every two adjacent organic liquid drops, and forms a refraction piece on a surface of each of the organic liquid drops, and the refraction piece and the piece of inorganic layer have a gap at a bottom of the organic liquid drops; depositing an organic ink on the first encapsulation inorganic layer, wherein the organic ink covers the organic liquid drops and the refraction piece; and depositing a second encapsulation inorganic layer on one side of the first encapsulation organic layer away from the first encapsulation inorganic layer.

Furthermore, a material of the organic liquid drops is same as that of the organic ink.

Furthermore, a diameter of the organic liquid drops is 1-10 um, and a distance between adjacent organic liquid drops is 1-10 um.

Furthermore, in the step of forming the plurality of organic liquid drops on the peripheral area of the substrate, the organic liquid drops are provided through inkjet printing.

Furthermore, in the step of depositing the first encapsulation inorganic layer on the display layer and the peripheral area of the substrate, the first encapsulation inorganic layer is provided through pulsed laser deposition, magnetron sputtering, and chemical vapor deposition.

The present invention provides a display panel and a manufacturing method thereof. Through disposing a refraction piece in a thin film encapsulation layer at a peripheral area of the display panel, having the refraction piece being disposed in a first encapsulation organic layer of the encapsulation layer, and refracting light through an opening of the refraction piece to a display area when light at the peripheral area passes through a substrate, display brightness at a place of the display area close to the peripheral area is increased. Furthermore, when preparing a structure of the refraction piece, through depositing organic liquid drops on the peripheral area of the substrate first, and then depositing a first encapsulation inorganic layer, the first encapsulation inorganic layer can form the structure of the refraction piece on a surface of the organic liquid drops, and the structure can act as a wall when preparing the first encapsulation organic layer to prevent overflow of an organic ink.

DESCRIPTION OF SPECIFIC EMBODIMENTS OF THE INVENTION

In order to make purposes, technical approaches, and effects of the present application more clear, the following describes the present application in detail with reference to accompanying drawings and embodiments. It should be understood that specific embodiments described here are only for explaining the present application and do not limit the present application.

Figure 1:
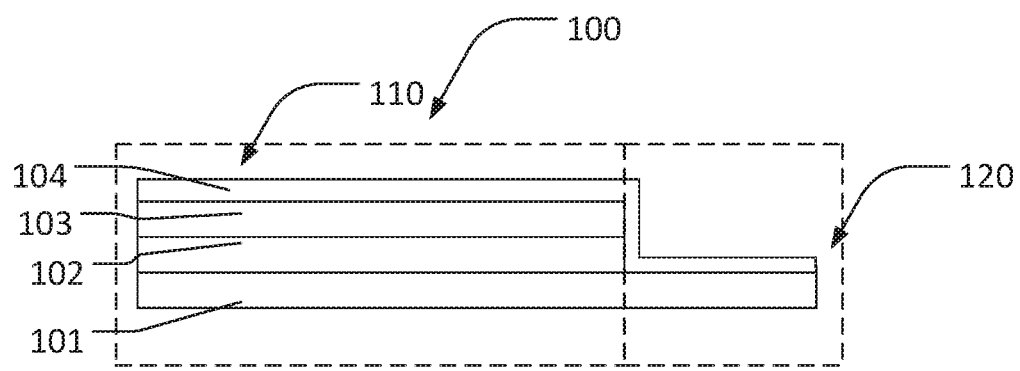
FIG. 1 is a structural schematic diagram of a display panel according to an embodiment of the present invention.

As shown in FIG. 1, an embodiment of the present invention provides a display panel 100 that includes a substrate 101, a thin film transistor layer 102, a display layer 103, and an encapsulation layer 104.

The substrate 101 has a display area 110 and a peripheral area 120. A material of the substrate 101 includes polyimide that is used to give the substrate 101 a flexible characteristic. The display panel 100 will perform a bending process at the peripheral area 120.

The thin film transistor layer 102 is disposed on the substrate 101 and corresponds to the display area 110. The display layer 103 is disposed on a side of the thin film transistor layer 102 away from the substrate 101. The thin film transistor layer 102 has multiple thin film transistors to drive the display layer 103 to emit light and display.

The encapsulation layer 104 is disposed on the display layer 103 and the peripheral area 120 of the substrate 101 to protect the display panel 100.

Figure 2:
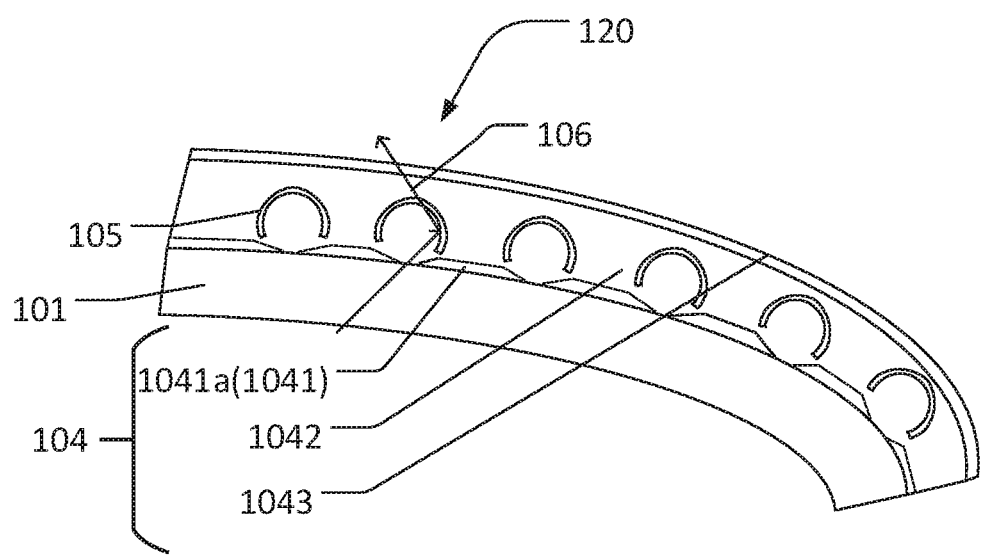
FIG. 2 is a structural schematic diagram of a peripheral area of a display panel after bending according to an embodiment of the present invention, mainly showing detailed structures of an encapsulation layer.

As shown in FIG. 2, the encapsulation layer 104 includes a first encapsulation inorganic layer 1041, a first encapsulation organic layer 1042, and a second encapsulation inorganic layer 1043.

The first encapsulation inorganic layer 1041 is disposed on the display layer 103 and the peripheral area 120 of the substrate 101. At the peripheral area 120, the first encapsulation inorganic layer 1041 includes a plurality of pieces of inorganic layer 1041a.

The first encapsulation organic layer 1042 is disposed on the first encapsulation inorganic layer 1041. The second encapsulation inorganic layer 1043 is disposed on one side of the first encapsulation organic layer 1042 away from the first encapsulation inorganic layer 1041.

At the peripheral area 120, the encapsulation layer 104 has a plurality of refraction pieces 105. Specifically, the refraction pieces 105 are disposed in the first encapsulation organic layer 1042. Furthermore, the refraction pieces 105 are disposed between adjacent pieces of inorganic layer 1041a.

A material of the refraction pieces 105 includes silicon nitride, silica, silicon oxynitride, silicon carbonitride, zinc oxide, or aluminum oxide.

A sectional shape of the refraction pieces 105 includes an arc, a line, or a square. In the present embodiment, it is preferably an arc structure of a "C" shape, and in another embodiment, a shape of the refraction pieces 105 is a linear structure of a "V" shape.

The refraction pieces 105 have an opening, the opening faces the substrate 101, and the refraction pieces 105 are used to refract light to the display area 110 after the light 106 at the peripheral area 120 passes the opening when passing through the substrate 101, thereby increasing display brightness at a place of the display area 110 close to the peripheral area 120.

Because the refraction pieces 105 are disposed in the first encapsulation organic layer 1042, when the peripheral area 120 of the display panel 100 is bent, the first encapsulation organic layer 1042 can mitigate stress produced and reduce a risk of failure after bending.

In another embodiment, the display panel according to the present invention further includes a transparent adhesive layer, which is not shown. The transparent adhesive layer is disposed on one side of the encapsulation layer 104 away from the substrate 101, and a plurality of spherical granules are disposed in the transparent adhesive layer. The spherical granules have high transparency, and hence, the refraction pieces 105 can refract light to the display area 110 after the light 106 at the peripheral area 120 passes the opening when passing through the substrate 101, thereby increasing display brightness at the place of the display area 110 close to the peripheral area 120.

Figure 3:
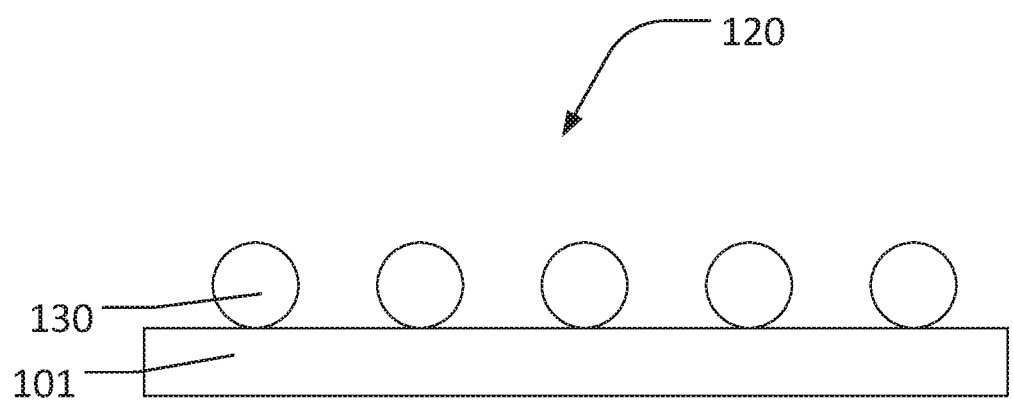
FIG. 3 is a structural schematic diagram of a peripheral area of a substrate according to an embodiment of the present invention, wherein organic liquid drops are formed at the peripheral area.

The present invention further provides a manufacturing method of a display panel. In one embodiment, the manufacturing method includes following steps:

S1, as shown in FIG. 3, providing a substrate 101, wherein the substrate 101 includes a display area 110 and a peripheral area 120.

S2, sequentially forming a thin film transistor layer 102 and a display layer 103 at the display area 110 of the substrate 101 (as shown in FIG. 1).

S3, as shown in FIG. 3, forming a plurality of organic liquid drops 130 on the peripheral area 120 of the substrate 101. A diameter of the organic liquid drops 130 is 1-10 um, and a distance between adjacent organic liquid drops 130 is 1-10 um.

Because the organic liquid drops 130 have greater wetting angles, a shape of the organic liquid drops 130 will remain stable and not spread. A shape of the organic liquid drops includes spherical, pyramidal, or cylindrical.

In the step of forming the plurality of organic liquid drops 130 on the peripheral area 120 of the substrate 101, the organic liquid drops 130 are provided through inkjet printing.

Figure 4:
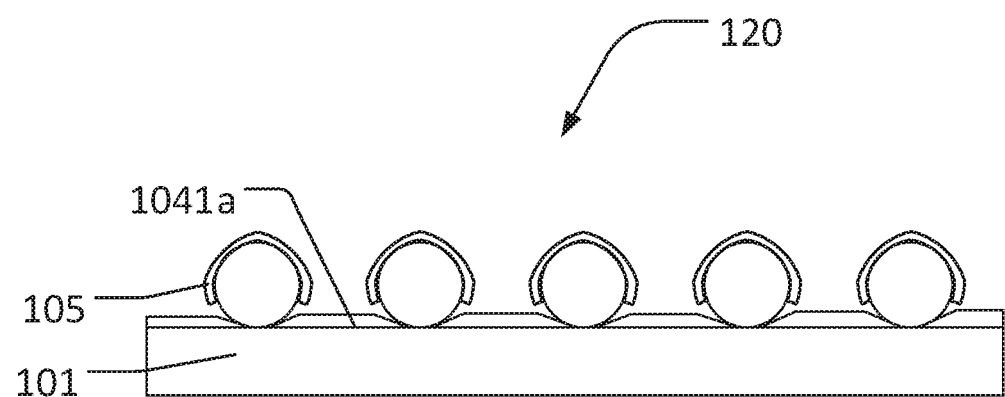
FIG. 4 is a structural schematic diagram of a peripheral area of a substrate according to an embodiment of the present invention, wherein organic liquid drops and a first encapsulation inorganic layer are formed at the peripheral area.

S4, as shown in FIG. 4, depositing a first encapsulation inorganic layer 1041 on the display layer 103 and the peripheral area 120 of the substrate 101. At the peripheral area 120, a process of vapor deposition cannot completely make the first encapsulation inorganic layer 1041 affix around the organic liquid drops 130. For example, the first encapsulation inorganic layer 1041 cannot be deposited at a bottom position where the organic liquid drops 130 contact the substrate 101. Therefore, the first encapsulation inorganic layer 1041 forms a plurality of pieces of inorganic layer 1041a on the substrate 101, the pieces of inorganic layer 1041a are disposed between adjacent organic liquid drops 130, and a refraction piece 105 is formed on a surface of the organic liquid drops 130.

The refraction piece 105 and the pieces of inorganic layer 1041a have a gap therebetween at a bottom of the organic liquid drops 130. That is, the refraction piece 105 does not completely enclose the organic liquid drops 130, the refraction piece 105 breaks at the bottom of the organic liquid drops 130, and thereby does not connect to the pieces of inorganic layer 1041a.

A material of the first encapsulation inorganic layer 1041 includes silicon nitride or silica, and the first encapsulation inorganic layer 1041 has hydrophobicity. The first encapsulation inorganic layer 1041 is provided through processes such as atomic layer deposition, pulsed laser deposition, magnetron sputtering, chemical vapor deposition, etc., and a material of the first encapsulation inorganic layer 1041 includes silicon nitride or silicon carbonitride.

Figure 5:
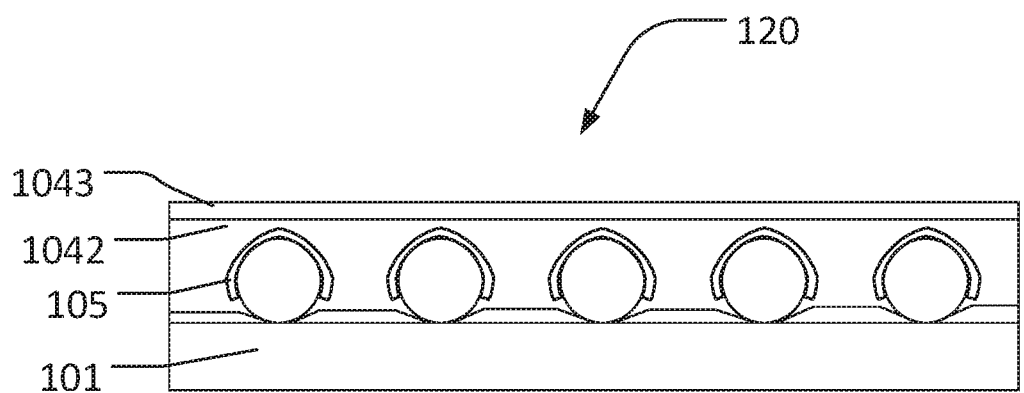
FIG. 5 is a structural schematic diagram of a peripheral area of a display panel before bending according to an embodiment of the present invention.

S5, as shown in FIG. 5, depositing an organic ink on the first encapsulation inorganic layer 1041, wherein the organic ink covers the organic liquid drops 130 and the refraction piece 105 and fills the gap. At the gap, the organic ink connects to and melts together with the organic liquid drops 130, and forms a first encapsulation organic layer 1042 after curing.

The organic liquid drops 130 and an edge structure of the refraction piece 105 form a wall, which decreases a flow speed of the organic ink at edges when printing and decreases a risk of overflow of the organic ink.

A material of the organic liquid drops 130 is same as that of the organic ink.

S6, depositing a second encapsulation inorganic layer 1043 on one side of the first encapsulation organic layer 1042 away from the first encapsulation inorganic layer 1041. The second encapsulation inorganic layer 1043 is provided through processes such as atomic layer deposition, pulsed laser deposition, magnetron sputtering, chemical vapor deposition, etc. Finally, a structure is formed after a bending process as shown in FIG. 2.

The present invention provides a display panel 100 and a manufacturing method thereof. Through disposing a refraction piece 105 in an encapsulation layer 104 at a peripheral area 120 of the display panel 100, having the refraction piece 105 being disposed in a first encapsulation organic layer 1042 of the encapsulation layer 104, and using the refraction piece 105 to refract light to the display area 110 after the light 106 at the peripheral area 120 passes the opening when passing through the substrate 101, display brightness at a place of the display area 110 close to the peripheral area 120 is increased. Furthermore, when preparing a structure of the refraction piece, through depositing organic liquid drops 130 on the peripheral area 120 of the substrate 101 first, and then depositing a first encapsulation inorganic layer 1041, the first encapsulation inorganic layer 1041 can form the structure of the refraction piece 105 on a surface of the organic liquid drops 130, and the structure can act as a wall when preparing the first encapsulation organic layer 1042 to prevent overflow of an organic ink.

It can be understood that a person of ordinary skill in the art can equivalently substitute or change according to a technical approach of the present application and its invention thought, and all these changes or substitutions are within a protection scope of claims of the present application.

What is claimed is:

1. A display panel, comprising:
    a substrate comprising a display area and a peripheral area;
    a thin film transistor layer disposed on the substrate and corresponding to the display area;
    a display layer disposed on one side of the thin film transistor layer away from the substrate; and
    an encapsulation layer disposed on the display layer and the peripheral area of the substrate;
    wherein at the peripheral area, and the encapsulation layer comprises a plurality of plurality of refraction pieces, each of the refraction pieces has an opening, wherein each opening faces the substrate.

2. The display panel as claimed in claim 1, wherein a material of the plurality of refraction pieces comprises silicon nitride, silica, silicon oxynitride, silicon carbonitride, zinc oxide, or aluminum oxide.

3. The display panel as claimed in claim 1, wherein the encapsulation layer comprises:
    a first encapsulation inorganic layer disposed on the display layer and the peripheral area of the substrate, wherein at the peripheral area, the first encapsulation inorganic layer comprises a plurality of pieces of inorganic layer;
    a first encapsulation organic layer disposed on the first encapsulation inorganic layer; and
    a second encapsulation inorganic layer disposed on one side of the first encapsulation organic layer away from the first encapsulation inorganic layer;
    wherein the plurality of refraction pieces are disposed in the first encapsulation organic layer, and each of the plurality of pieces of inorganic layer is disposed between adjacent refraction pieces of the plurality of refraction pieces.

4. The display panel as claimed in claim 1, wherein a sectional shape of the plurality of refraction pieces comprises an arc, a line, or a square.

5. The display panel as claimed in claim 1, further comprising:
    a transparent adhesive layer disposed on one side of the encapsulation layer away from the substrate;
    wherein a plurality of spherical granules are disposed in the transparent adhesive layer.

6. A manufacturing method of a display panel, comprising following steps:
    providing a substrate, wherein the substrate comprises a display area and a peripheral area;
    sequentially forming a thin film transistor layer and a display layer at the display area of the substrate;
    forming an encapsulation layer on the display layer and the peripheral area of the substrate, wherein at the peripheral area, the encapsulation layer comprises a plurality of refraction pieces, each of the plurality of refraction pieces has an opening facing the substrate.

7. The manufacturing method of the display panel as claimed in claim 6, wherein the step of forming the encapsulation layer on the display layer and the peripheral area of the substrate, wherein at the peripheral area, the encapsulation layer comprises the plurality of refraction pieces, and each of the plurality of refraction pieces has the opening facing the substrate, comprises following steps:
    forming a plurality of organic liquid drops on the peripheral area of the substrate;

depositing a first encapsulation inorganic layer on the display layer and the peripheral area of the substrate, wherein the first encapsulation inorganic layer forms a plurality of pieces of inorganic layer between adjacent organic liquid drops of the plurality of organic liquid drops, and forms the plurality of refraction pieces on a surface of each of the plurality of organic liquid drops, and the plurality of refraction pieces and the plurality of pieces of inorganic layer have a gap at a bottom of the plurality of organic liquid drops;

depositing an organic ink on the first encapsulation inorganic layer, wherein the organic ink covers the plurality of organic liquid drops and the plurality of refraction pieces, fills the gap, and forms a first encapsulation organic layer after curing; and depositing a second encapsulation inorganic layer on one side of the first encapsulation organic layer away from the first encapsulation inorganic layer;

wherein a material of the plurality of organic liquid drops is same as that of the organic ink.

8. The manufacturing method of the display panel as claimed in claim 7, wherein a diameter of the plurality of organic liquid drops ranges from 1 to 10 um, and a distance between the adjacent organic liquid drops of the plurality of organic liquid drops ranges from 1 to 10 um.

9. The manufacturing method of the display panel as claimed in claim 7, wherein in the step of forming the plurality of organic liquid drops on the peripheral area of the substrate, the plurality of organic liquid drops are provided through inkjet printing.

10. The manufacturing method of the display panel as claimed in claim 7, wherein in the step of depositing the first encapsulation inorganic layer on the display layer and the peripheral area of the substrate, the first encapsulation inorganic layer is provided through pulsed laser deposition, magnetron sputtering, and chemical vapor deposition.

* * * * *